(12) United States Patent
Delalleau

(10) Patent No.: US 10,074,429 B2
(45) Date of Patent: Sep. 11, 2018

(54) COMPACT NON-VOLATILE MEMORY DEVICE

(71) Applicant: STMicroelectronics (Rousset) SAS, Rousset (FR)

(72) Inventor: Julien Delalleau, Marseille (FR)

(73) Assignee: STMICROELECTRONICS (ROUSSET) SAS, Rousset (FR)

( * ) Notice: Subject to any disclaimer, the term of this patent is extended or adjusted under 35 U.S.C. 154(b) by 0 days.

(21) Appl. No.: 15/895,732

(22) Filed: Feb. 13, 2018

(65) Prior Publication Data
US 2018/0174655 A1 Jun. 21, 2018

Related U.S. Application Data

(63) Continuation of application No. 15/436,831, filed on Feb. 19, 2017, now Pat. No. 9,922,712.

(30) Foreign Application Priority Data

Aug. 5, 2016 (FR) .................................... 16 57586

(51) Int. Cl.
| | | |
|---|---|---|
| *G11C 11/34* | (2006.01) | |
| *G11C 16/04* | (2006.01) | |
| *G11C 16/26* | (2006.01) | |
| *G11C 16/12* | (2006.01) | |
| *G11C 16/14* | (2006.01) | |
| *H01L 27/11556* | (2017.01) | |
| *H01L 27/11521* | (2017.01) | |

(52) U.S. Cl.
CPC .......... *G11C 16/0433* (2013.01); *G11C 16/12* (2013.01); *G11C 16/14* (2013.01); *G11C 16/26* (2013.01); *H01L 27/11521* (2013.01); *H01L 27/11556* (2013.01)

(58) Field of Classification Search
CPC ............. H01L 27/115; H01L 27/11521; G11C 16/0433; G11C 16/0146; G11C 16/0483
USPC .......................... 365/185.05, 185.18, 185.29
See application file for complete search history.

(56) References Cited

U.S. PATENT DOCUMENTS

| | | | |
|---|---|---|---|
| 5,780,892 A | 7/1998 | Chen | |
| 8,847,326 B2 * | 9/2014 | Yamazaki | ......... H01L 27/11517 257/392 |
| 9,224,482 B2 | 12/2015 | La Rosa et al. | |
| 9,443,598 B2 | 9/2016 | La Rosa et al. | |
| 2004/0262668 A1 | 12/2004 | Wang | |
| 2005/0275002 A1 | 12/2005 | Shone | |
| 2013/0250700 A1 * | 9/2013 | La Rosa | ................ H01L 29/788 365/185.29 |

FOREIGN PATENT DOCUMENTS

FR 3012673 A1 5/2015

\* cited by examiner

*Primary Examiner* — Son Dinh
(74) *Attorney, Agent, or Firm* — Slater Matsil, LLP

(57) ABSTRACT

A non-volatile memory cell includes a selection transistor having an insulated selection gate embedded in a semiconducting substrate region. A semiconducting source region contacts a lower part of the insulated selection gate. A state transistor includes a floating gate having an insulated part embedded in the substrate region above an upper part of the insulated selection gate, a semiconducting drain region, and a control gate insulated from the floating gate and located partially above the floating gate. The source region, the drain region, the substrate region, and the control gate are individually polarizable.

19 Claims, 22 Drawing Sheets erasure erasure programming reading erasure erasure programming reading

COMPACT NON-VOLATILE MEMORY DEVICE

CROSS-REFERENCE TO RELATED APPLICATIONS

This application is a continuation of U.S. patent application Ser. No. 15/436,831, filed Feb. 19, 2017, which application claims priority to French Patent Application No. 1657586, filed on Aug. 5, 2016, which applications are hereby incorporated herein by reference.

TECHNICAL FIELD

Embodiments of the invention relate to non-volatile memories.

SUMMARY

There is a constant need at the present time for a reduction in the size of memory cells.

Thus, according to one embodiment, a particularly compact memory cell is proposed and has overall dimensions on silicon substantially equivalent to the footprint of a transistor.

According to one aspect, a non-volatile memory device comprises at least one memory cell. The memory cell includes a selection transistor comprising an insulated selection gate embedded in a semiconducting substrate region. A semiconducting source region contacts a lower part of the embedded insulated selection gate. A state transistor comprises a floating gate having at least one part insulated and embedded in the substrate region above an upper part of the insulated and embedded selection gate, a semiconducting drain region, and a control gate insulated from the floating gate and located partially above the floating gate. The source, drain and substrate regions, together with the control gate, being individually polarizable.

Thus, in this memory cell, the selection transistor is an embedded transistor, and the state transistor is at least partially embedded with the floating and control selection gates stacked on one another, making it possible to reduce the overall surface area of this memory cell on silicon.

This memory cell is advantageously erasable by the Fowler-Nordheim effect and programmable by injection of hot carriers on the source side, a phenomenon known to those skilled in the art by the acronym SSI ("Source Side Injection").

In a variant, the floating gate may be entirely embedded in the substrate.

According to yet another possible variant, the floating gate may comprise two insulated blocks separated by a first part of the control gate extending to the vicinity of the embedded insulated selection gate, and surmounted by a second part of the control gate.

As a general rule, and notably in the context of the incorporation of the memory cell within a memory plan comprising a matrix of memory cells, the substrate region may comprise two individually polarizable substrate areas, located on either side of the embedded selection gate and of the at least one embedded part of the floating gate.

Similarly, the drain region may comprise two individually polarizable drain areas, located on either side of the at least one embedded part of the floating gate.

According to one embodiment, the memory device comprises a memory plan comprising a plurality of memory cells arranged in matrix form along first lines parallel to a first direction and second lines parallel to a second direction.

The control gates of all the cells of the same first line may then be polarized by a first metallization layer.

The drain areas of all the memory cells of the same first line may be polarized by a second metallization layer, for example a bit line, and two adjacent memory cells of the same first line share a common drain area.

The selection gates of all the cells of the same second line may be polarized by a third metallization layer, for example a word line, and two adjacent memory cells of the same first line share a common substrate area.

All the common substrate areas of the same second line may then be polarized by a fourth metallization layer, parallel to the word line for example.

Finally, the source areas of all the memory cells of the memory plan may be polarized simultaneously, usually by means of a plurality of contact areas, in order to minimize the resistance of access to the source areas.

According to another aspect, a method is proposed for erasing a memory cell of a memory device such as that defined above, comprising the application of an erasing potential difference, above an erasure threshold, between the control gate and the substrate region, the voltage present on the embedded selection gate being adapted to prevent a breakdown of the insulating material designed to insulate the embedded selection gate from the substrate region. This can be done by keeping the potential of the selection gate floating, or by the application of a first voltage to the embedded selection gate to prevent the breakdown of the insulating material designed to insulate the embedded selection gate from the substrate region.

In this erasure method, it is also possible, for example, to keep the potential of the drain region floating and to keep the potential of the source region floating, or to apply a zero voltage to it.

If the substrate region comprises two substrate areas and the drain region comprises two drain areas, the erasing potential difference, above the erasure threshold, may be applied between the control gate and at least one of the two substrate areas while keeping the potential of the selection gate floating, or while applying the first voltage to the embedded selection gate which is adapted to prevent the breakdown of the insulating material designed to insulate the embedded selection gate from the substrate region.

It is also possible to keep the potential of the two drain areas floating while keeping the potential of the source region floating, or while applying a zero voltage to it.

There is another possible variant of the operation of erasing a memory cell of this memory device. According to this other variant, a second voltage may be applied to the control gate and a third voltage may be applied to the selection gate so as to generate an erasing potential difference, above an erasure threshold, between the control gate and the selection gate.

The potential and the substrate region may be kept floating, or alternatively the substrate region may be polarized with a zero voltage.

Here again, the third voltage applied to the selection gate is adapted to prevent the breakdown of the insulating material designed to insulate the embedded selection gate from the substrate region.

In other words, according to this other variant, the erasing potential difference is applied between the control gate and the selection gate, whereas, in the preceding erasure variant, the erasing potential difference was applied between the control gate and the substrate region.

Here again, according to this other variant, the potential of the drain region may be kept floating, and either the potential of the source region is kept floating or a zero voltage is applied to it.

According to another aspect, a method is proposed for programming a memory cell of a memory device such as that defined above, comprising the application of an programming potential difference, above a programming threshold (which is usually lower than the erasure threshold), between the control gate and the substrate region, and the application of a fourth voltage to the embedded selection gate, adapted to make the selection transistor conduct.

Advantageously, a programming voltage is also applied to the drain region, and a zero voltage is applied to the source region. If the drain region comprises two drain areas, the programming voltage may be applied to one of the two drain areas or to both of them.

According to yet another aspect, a method is proposed for reading a memory cell of a memory device such as that defined above, comprising the application of a read control voltage to the control gate, the application of a fifth voltage to the selection gate so as to make the selection transistor conduct, and the application of a read voltage to the drain region, the source region and the substrate region being connected to a zero voltage (the earth, for example).

If use is made, in the context of the erasure of a memory plan of the device, of the erasure variant in which the erasing potential difference is applied between the control gate and the substrate region, it is then possible to erase two adjacent memory cells belonging to the same first line of the memory device, by applying the erasing potential difference between the control gates of all the memory cells of the first line and the substrate area common to these two adjacent memory cells.

Conversely, if use is made of the erasure variant in which the erasing potential difference is applied between the control gate and the selection gate, it is possible to erase one memory cell of the memory device at a time by applying the second voltage to the control gate and the third voltage to the selection gate of the memory cell so as to generate the erasing potential difference between the control gate and the selection gate of this memory cell only.

It is also possible to program a memory cell of a memory plan of the memory device as defined above by applying the programming method as defined above, by applying the programming potential difference between the control gate and the substrate region of this memory cell while making the selection transistor of this memory cell conduct.

It is also possible to read a memory cell of the memory plan of the memory device as defined above by applying the reading method as defined above, by applying the read control voltage to the control gate of this memory cell while making only the selection transistor of this memory cell conduct.

BRIEF DESCRIPTION OF THE DRAWINGS

Other advantages and features of the invention will be apparent from a perusal of the detailed description of embodiments and applications, which are not limiting in any way, and the appended drawings, in which.

DETAILED DESCRIPTION OF ILLUSTRATIVE EMBODIMENTS

Figure 1:
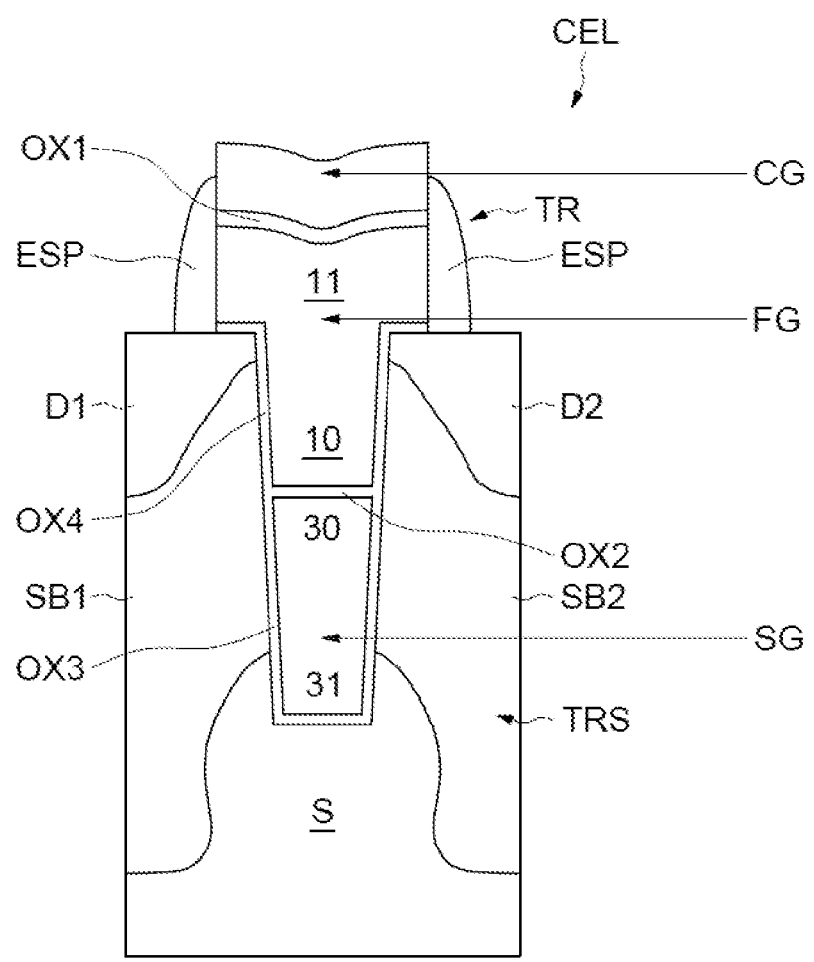
FIGS. 1 to 22 relate, in a schematic way, to different aspects of the invention.

In FIG. 1, the reference CEL denotes a non-volatile memory cell comprising a selection transistor TRS and a state transistor TR.

Here, the selection transistor is an embedded vertical transistor comprising an insulated selection gate SG embedded in a substrate region.

The state transistor TR comprises a floating gate FG, which, in this embodiment, has a part 10 embedded in the substrate region and a part 11 projecting above the substrate region.

The state transistor TR also comprises a control gate CG, insulated from the floating gate FG, and, more particularly in this case, insulated from the projecting upper part ii of this floating gate, by an insulating material OX1, for example a gate oxide such as silicon dioxide, although this example is not in any way limiting.

The memory cell CEL also comprises, in the substrate region, a drain region and a source region S.

The embedded selection gate SG is electrically insulated from the substrate region and the source region S by an insulating material OX3 which may be of the gate oxide type, for example silicon dioxide.

Consequently, the source region S is in contact with the insulated lower part 31 of the selection gate SG.

The embedded part 10 of the floating gate FG is electrically insulated from the upper part 30 of the selection gate SG by an insulating material OX2 which, here again, may be of the gate oxide type, for example silicon dioxide.

Finally, the embedded part 10 of the floating gate is electrically insulated from the substrate region and from the drain region by an insulating material OX4 which, here again, may be of the gate oxide type, for example silicon dioxide.

The thickness of the insulating material OX2 is at least equal to, and preferably greater than, the thickness of the other insulating materials OX1, OX3 and OX4, so as to generate a good electric field between the selection gate and the floating gate during the programming of the cell.

Although the substrate region and the drain region may completely surround the embedded selection gate and the embedded part of the floating gate, these two regions generally comprise, notably for the purpose of integration into a memory plan comprising a matrix of memory cells, two substrate areas SB1 and SB2 and two drain areas D1 and D2, placed on either side of the embedded selection gate SG and of the embedded part 10 of the floating gate.

Finally, the transistor TR comprises, in a conventional manner, insulating spacers ESP on the sides of the projecting part 11 of the floating gate and on the sides of the control gate CG.

In the example illustrated here, the two drain areas D1 and D2 come into contact with the insulated embedded part of the floating gate. However, these two drain areas could also be remote from this embedded part of the floating gate.

Additionally, as is detailed below, the control gate CG, each of the drain areas D1 and D2, each of the substrate areas SB1 and SB2, the selection gate SG and the source region S are individually polarizable by means of electrically conductive lines such as metallization layers.

In other words, they may be polarized in an individual manner by voltages that may be different or identical, at least as regards some of them.

In this context, as is conventional in this field, silicided areas (not shown in this figure, for the sake of simplicity) are provided to enable contact to be made by electrically conductive contacts that connect these silicided areas to the metallization layers.

By way of example, the substrate areas SB1 and SB2 may have the p-type of conductivity, while the source region and drain areas D1 and D2 may have the n-type of conductivity.

Additionally, the thickness of the different insulating materials depends on the technology used, and may be, for example, of the order of a hundred angstrom.

However, as detailed below, the thickness of the insulating material OX3 is advantageously chosen on the basis of the voltages that will be applied to the selection gate SG in certain cases, in order to prevent the breakdown of this insulating material OX3.

It should be noted that the selection transistor TRS has a source region S, but no drain region as such, whereas the state transistor TR has a drain region D1 and D2, but no source region as such.

However, following the common practice in this technical field, the incorrect usage widespread among those skilled in the art will be accepted, and the term "transistor" will still be used to denote the selection transistor TRS and the state transistor TR, in spite of the absence of a drain region in one case and a source region in the other.

Reference will now be made to FIGS. 2 to 5 for the description of different methods for the erasure, programming and reading of a memory cell such as that illustrated in FIG. 1.

As detailed below, this memory cell may be erased by the Fowler-Nordheim effect; that is to say, the erasure comprises the extraction of the electrical charges contained in the floating gate of the transistor by a tunnel effect, while the memory cell may be programmed by carrier injection on the source side (known as SSI, for "Source Side Injection").

Figure 2:
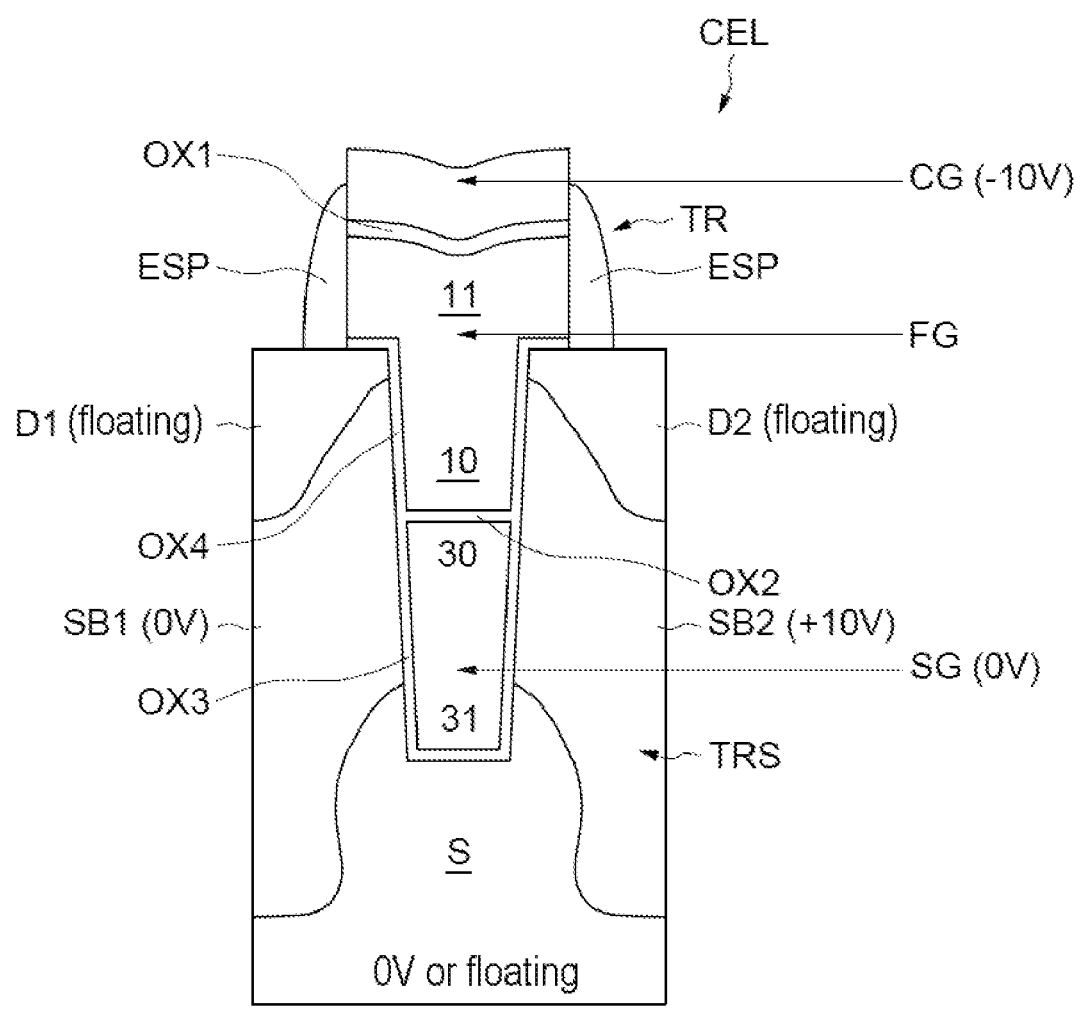

Reference will now be made, more particularly, to FIG. 2, to describe a first mode of erasure of the memory cell CEL of FIG. 1.

In this case, an erasing potential difference above an erasure threshold is applied between the control gate CG and one of the substrate areas, for example the substrate area SB2. By way of example, an erasure threshold is about 14 volts, for example.

In this case, the erasing potential difference is set at 20 volts, which is above the erasure threshold.

This erasing potential difference is produced by applying, for example, a voltage of −10 volts to the control gate CG and a voltage of +10 volts to the substrate area SB2. The other substrate area SB1 may be earthed, for example. A first zero voltage, or possibly a first voltage of several volts, may be applied to the selection gate SG; alternatively, the potential of this selection gate may be kept floating.

In any case, the voltage present on this selection gate must be adapted to prevent the breakdown of the insulating material OX3. In the example described here, a material OX3 having a thickness of 90 angstrom can withstand a potential difference of about 10 volts between the selection gate SG and the substrate area SB2.

The two drain areas D1 and D2 can be kept floating.

As regards the source region, it may, for example, have a zero voltage applied to it (by being earthed, for example), or may be kept floating.

Figure 3:
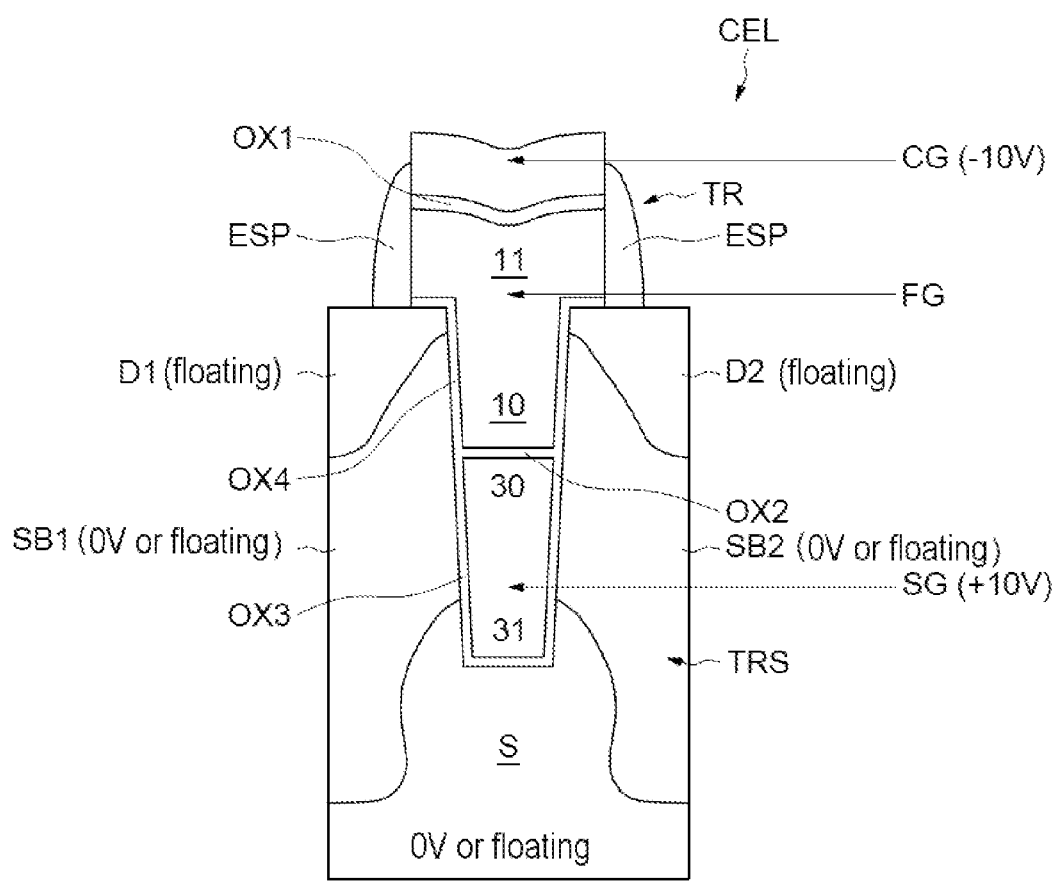

Reference will now be made more particularly to FIG. 3, to describe a second mode of erasure of the memory cell CEL.

In this variant, the erasing potential difference is applied between the control gate CG and the selection gate SG. More particularly, a second voltage (a voltage of −10 volts, for example) is applied to the control gate CG, and a third voltage, for example a third voltage of +10 volts, is applied to the selection gate.

On the other hand, the potential of the two substrate areas SB1 and SB2, that is to say the potential of the substrate region, is kept floating. In a variant, the two substrate areas SB1 and SB2 may be connected to the earth (0 volts).

Clearly, once again, the third voltage applied to the selection gate SG is chosen to prevent the breakdown of the insulating material OX3, in view of the potential difference between the selection gate SG and the substrate areas SB1 and SB2.

The potential of the drain region D1 and D2 may be kept floating. The potential of the source region may also be kept floating, or a zero voltage may be applied to it.

As detailed below, this mode of erasure may be used for the individual erasure of one cell of the memory plan, while the mode of erasure described with reference to FIG. 2 results in the simultaneous erasure of two adjacent memory cells having a common substrate area.

Figure 4:
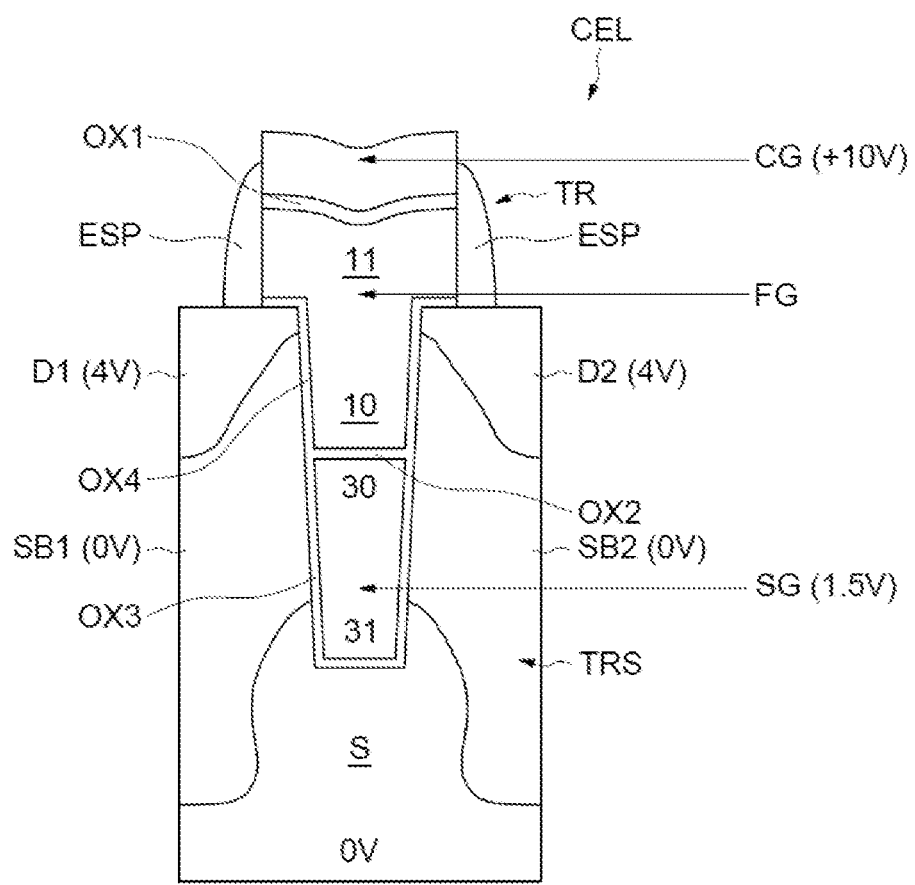

Reference will now be made more particularly to FIG. 4, to describe a mode of programming the memory cell CEL.

To perform this programming, a programming potential difference is applied, this potential difference being above a programming threshold which is usually below the erasure threshold. For guidance, a programming threshold is about 7 volts. The programming threshold is the voltage above which programming is carried out within an acceptable period, taking the planned application into account.

In the example described here, a voltage of +10 volts is applied to the control gate CG, while a zero voltage is applied to the two substrate areas SB1 and SB2. This programming potential difference of +10 volts is therefore well above the programming threshold.

Additionally, a fourth voltage, 1.5 volts in this case, is applied to the embedded selection gate, this voltage being adapted to make the selection transistor conduct.

As regards the drain areas D1 and D2, a programming voltage, of between 3 and $_5$ volts for example, or of about 4 volts for example, is applied to one or both of these areas so as to produce a sufficient drain current, while a zero voltage is applied to the source region S.

In this case, the programming is performed by means of the SSI (Source Side Injection) phenomenon.

More precisely, a potential difference is created along the channel because of the spacing of the floating gate and the selection gate by the oxide OX2, as well as by the difference in the potentials of these two gates. The potential of the floating gate is sufficiently higher than that of the selection gate.

Thus a vertical electric field is generated in the channel area separating these two gates.

The electrons coming from the source when the selection transistor is conducting are accelerated by this electric field, gain kinetic energy, and have a high probability of having a higher energy than the potential barrier of the tunnel oxide, and a high probability of being attracted towards the floating gate once they are in the channel of the state transistor (because of the horizontal potential difference between the channel and the floating gate).

To ensure that the electrons flow in a sufficient quantity in the channel, it is advantageous to establish a relatively high drain potential, between 3 and 5 volts in this case.

Figure 5:
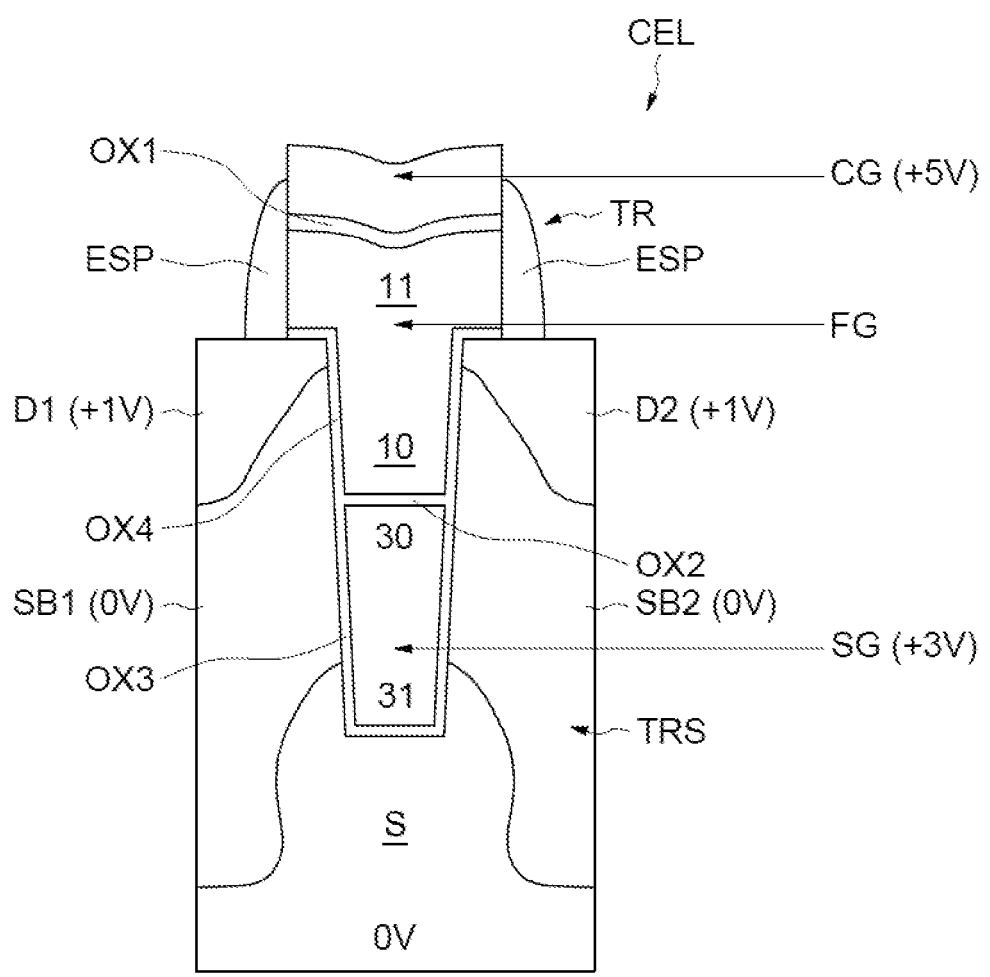

Reference will now be made more particularly to FIG. 5, to describe a mode of reading the memory cell CEL.

To read the cell CEL, a read control voltage, for example +5 volts, is applied to the control gate CG, while a fifth voltage, for example +3 volts, is applied to the selection gate SG, so as to make the selection transistor conduct.

A read voltage, for example +1 volt, is also applied to one of the two drain areas Di and D2, the source region S and the two substrate areas SB1 and SB2 being connected to a zero voltage (the earth, for example).

Figure 6:
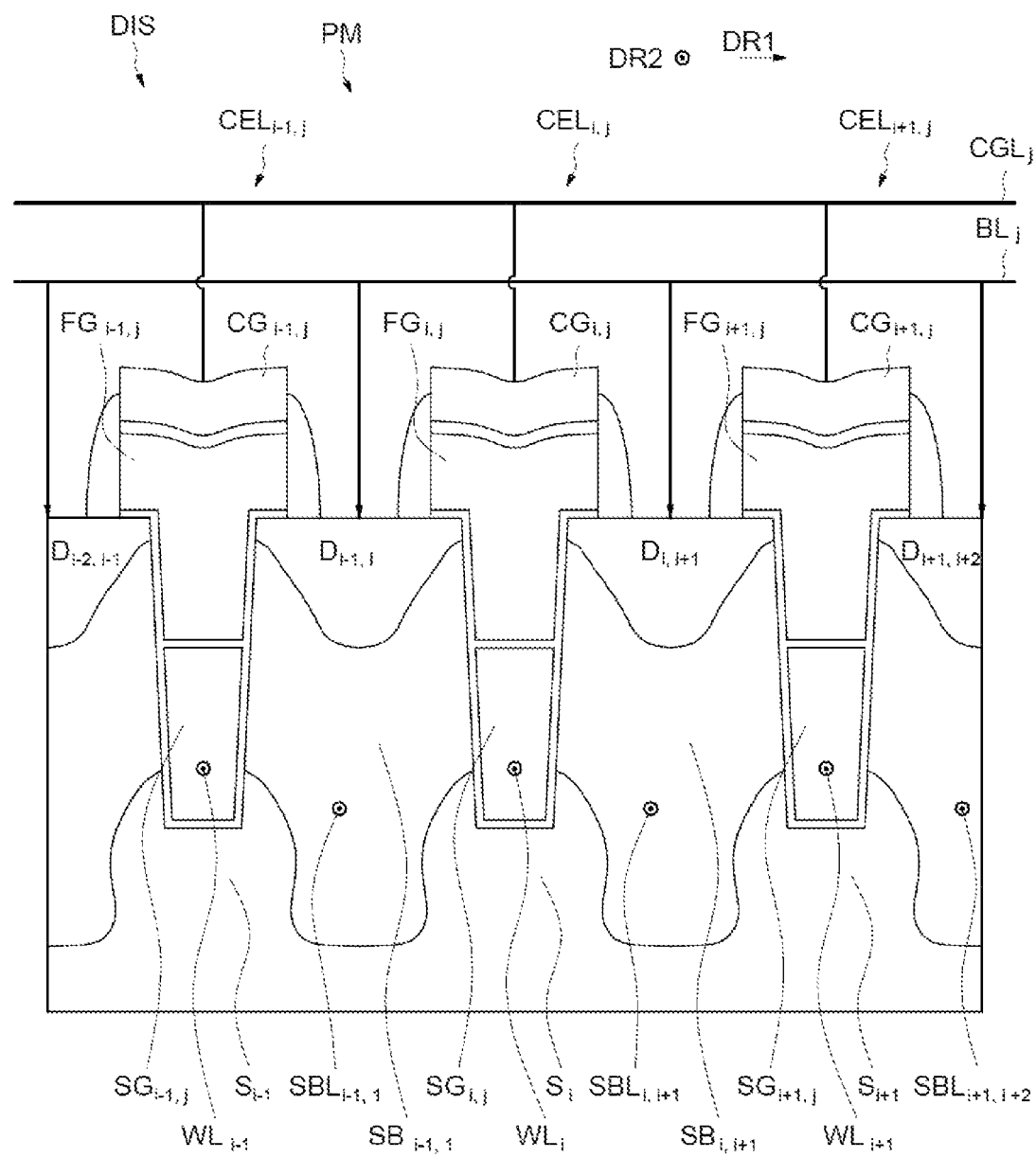

Reference will now be made more particularly to FIG. 6, to describe an exemplary embodiment of a non-volatile memory device comprising a memory plan PM of memory cells CEL such as those described above.

The memory plan PM comprises a plurality of memory cells $CEL_{i,j}$, arranged in matrix form along first lines parallel to a first direction DR1 and second lines parallel to a second direction DR2.

The control gates $CG_{i-1,j}$, $CG_{i,j}$, $CG_{i+1,j}$ of all the cells of the same first line having the index j may then be polarized by a first metallization layer $CGL_j$.

The drain areas $D_{i-2,i-1}$, $D_{i-1,i}$, $D_{i,i+1}$, $D_{i+1,i+2}$ of all the cells $CEL_{i-i,j}$, $CEL_{i,j}$, $CEL_{i+i,j}$ may be polarized by a second metallization layer BLj (or bit line).

Additionally, two adjacent memory cells $CEL_{i,j}$ and $CEL_{i+1,j}$ of the same first line having the index j share a common drain area Di,i+1.

The selection gates $SG_{i,j}$, $SG_{i,j+1}$, . . . of all the cells $CEL_{i,j}$, $CEL_{i,j+1}$, . . . of the same second line having the index i may be polarized by a third metallization layer $WL_i$ (or word line).

Additionally, two adjacent memory cells $CEL_{i,j}$ and $CEL_{i+1,j}$ of the same first line having the index j share a common drain area $SB_{i,i+1}$, and all these common substrate areas of the same second line having the index i may be polarized by a fourth metallization layer $SBL_{i,i+1}$.

Finally, the source regions S of all the memory cells of the memory plan may be polarized simultaneously, preferably by means of a plurality of contacts, in order to minimize the resistance of access to the source plan.

Reference will now be made more particularly to FIGS. 7 to 10 for the description of the erasure, programming and reading methods used in the memory plan PM illustrated in FIG. 6.

Figure 7:
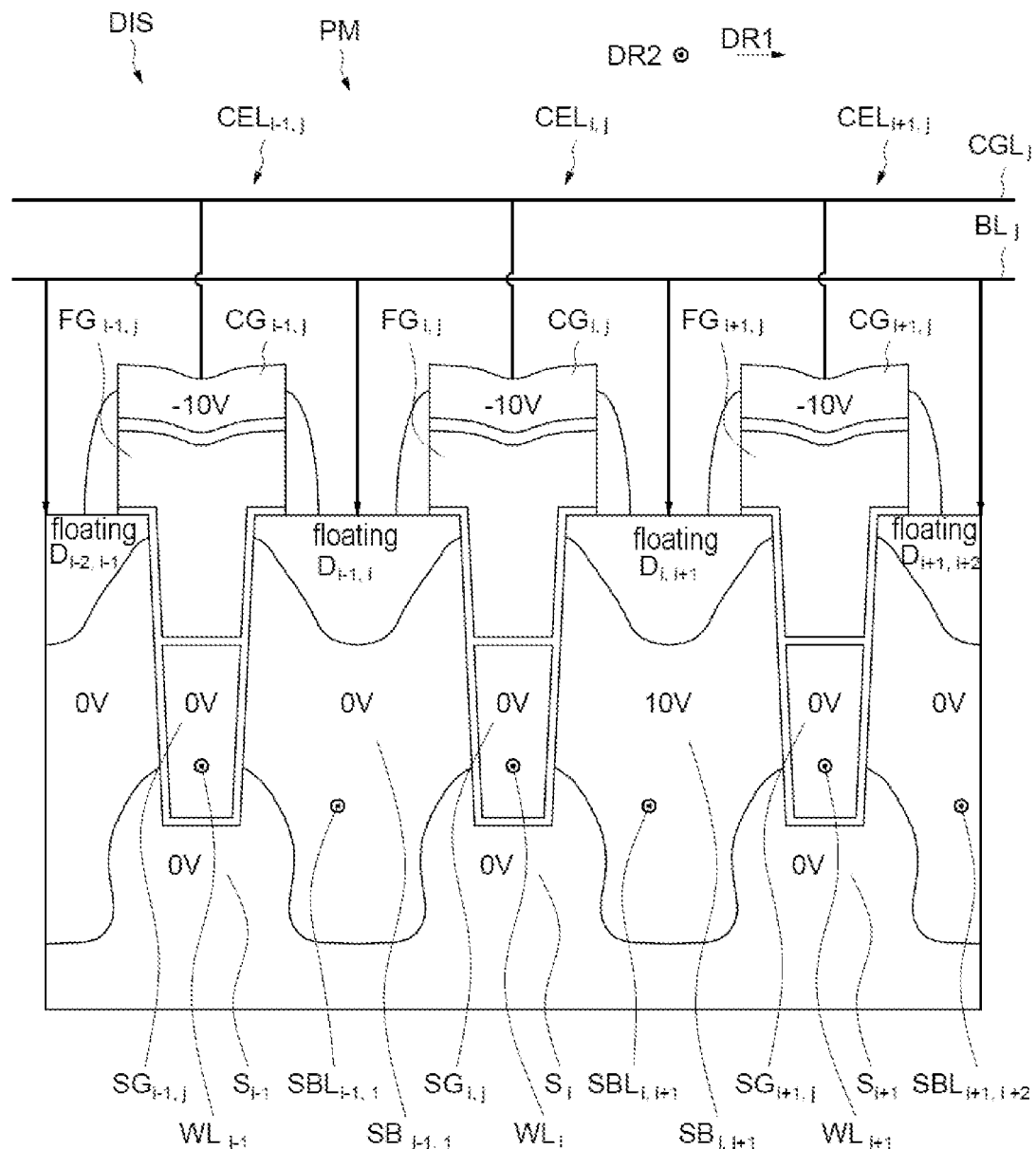

In FIG. 7, a voltage of −10 volts is applied to the line $CGL_j$, and a zero voltage is applied to the other lines CGL having indices other than j.

Additionally, since the common substrate areas are individually polarizable, a voltage of +10 volts is applied to the common substrate area $SB_{i,i+1}$ and a zero voltage is applied to the other common substrate areas $SB_{i-1,i}$, $SB_{i+1, i+2}$ by means of the corresponding metallization layers $SBL_{i,i+1}$, $SBL_{i-1,i}$ et $SBL_{i+1, i+2}$. A zero voltage is also applied to all the selection gates of all the memory cells of the memory plan, and the same is done for the source areas, while the drain areas $D_{i-2,i-1}$, $D_{i-1,i}$, $D_{i,i+1}$, $D_{i+1,i+2}$. . . are kept floating.

Therefore, an erasing potential difference above the erasure threshold is applied between the control gate $CG_{i,j}$ of the memory cell $CEL_{i,j}$ and the common substrate area $SB_{i,i+1}$, and between the control gate $CG_{i+1,j}$ of the adjacent memory cell $CEL_{i+1,j}$ and the same common substrate area $SB_{i,i+1}$.

Thus the two adjacent cells $CEL_{i,j}$ and $CEL_{i+1,j}$ of the first line having the index j are erased simultaneously.

Figure 8:
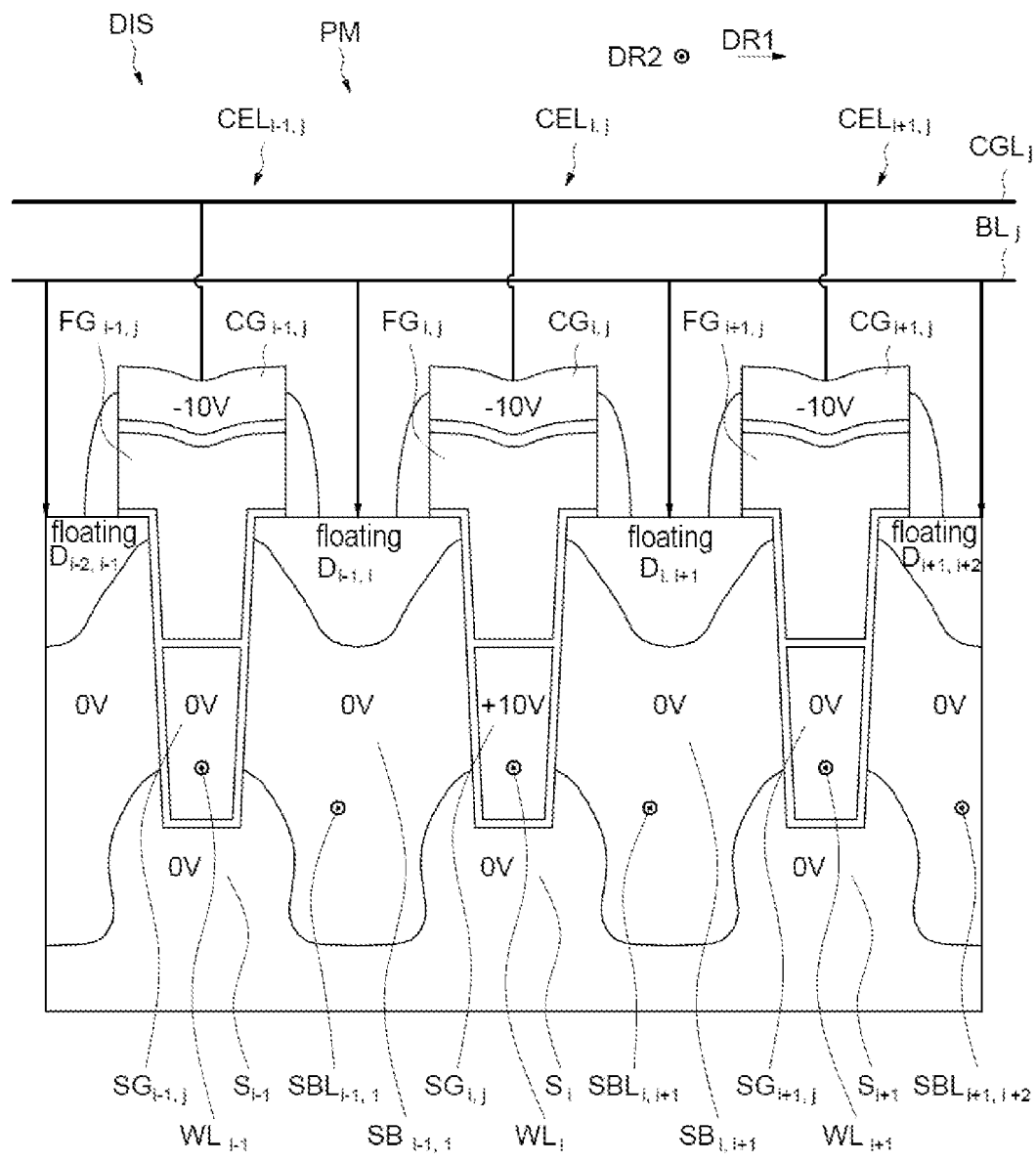

In the erasure mode shown in FIG. 8, the voltage of −10 volts is applied to the control gates coupled to the gate $CGL_j$ and a zero voltage is applied to the control gates connected to the metallization layers CGL having an index other than j, while a zero voltage is applied to all the selection gates of all the memory cells except the selection gate $SG_{i,j}$ of the memory cell $CEL_{i,j}$, to which the voltage of +10 is applied via the word line $WL_i$.

Here again, the sources are brought to zero potential and the drain areas are kept floating.

Consequently, since a zero voltage is applied to the control gates connected to the metallization layers CGL other than the metallization layer $CGL_j$, the erasing potential difference of +20 volts is applied solely between the control gate $CG_{i,j}$ and the selection gate $SG_{i,j}$ of the cell $CEL_{i,j}$, so that this memory cell alone can be erased.

Figure 9:
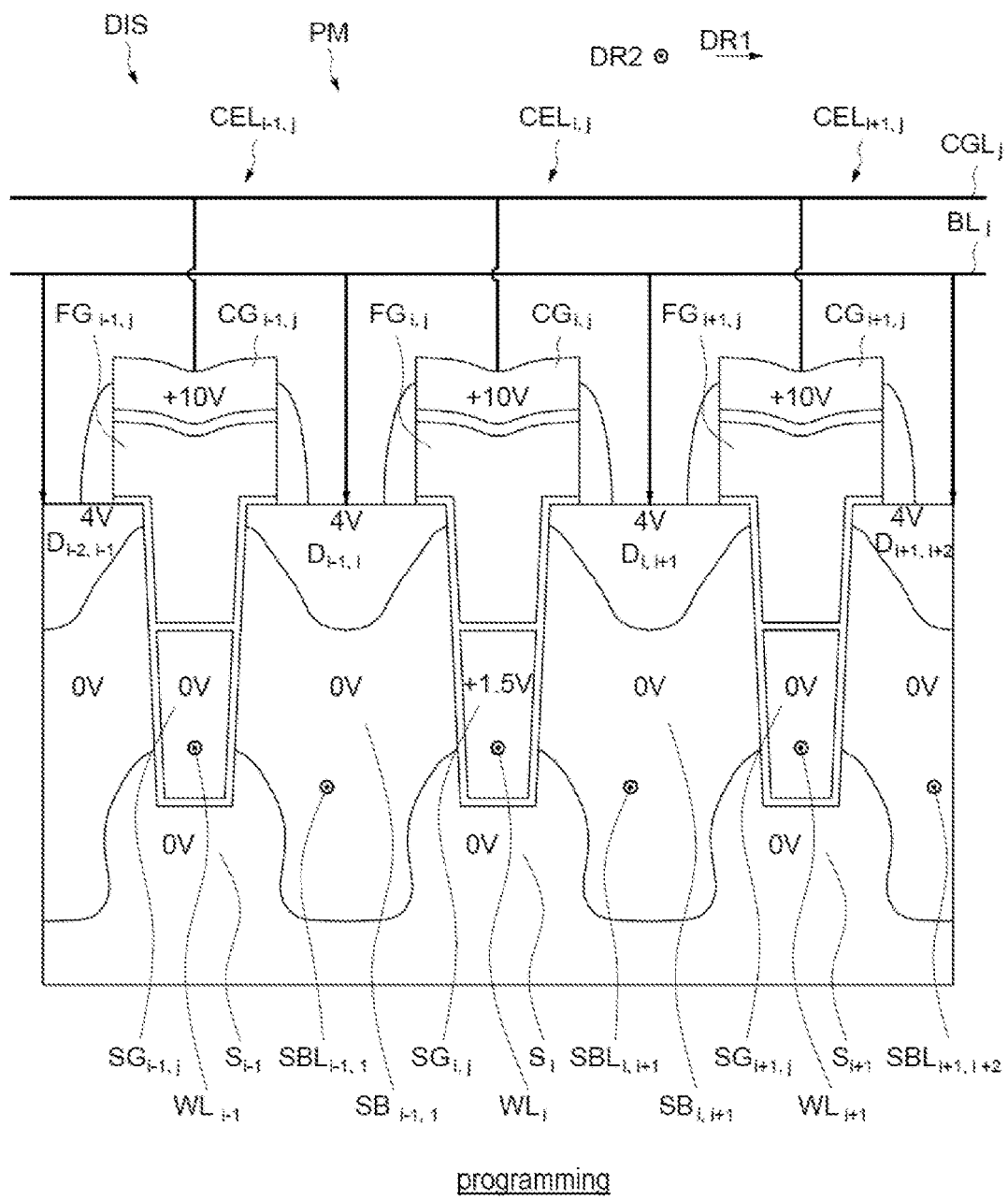

FIG. 9 shows a mode of programming the memory cell CELi,j of the memory plan PM.

In this procedure, the voltage of +10 volts is applied to the control gates connected to the line $CGL_j$, and the zero voltage is applied to the other control gates connected to the lines CGL having an index other than j.

A zero voltage is applied to all the substrate areas and also to the source areas.

A voltage de 1.5 volts is also applied to the selection gates of all the memory cells connected to the word line $WL_i$, while a voltage of 4 volts, for example, is applied to the drain areas connected to the bit line $BL_j$.

Consequently, only the memory cell $CEL_{i,j}$ has its selection transistor conducting while also having a potential difference of +10 volts between its control gate and these substrate areas, enabling it to be programmed.

Figure 10:
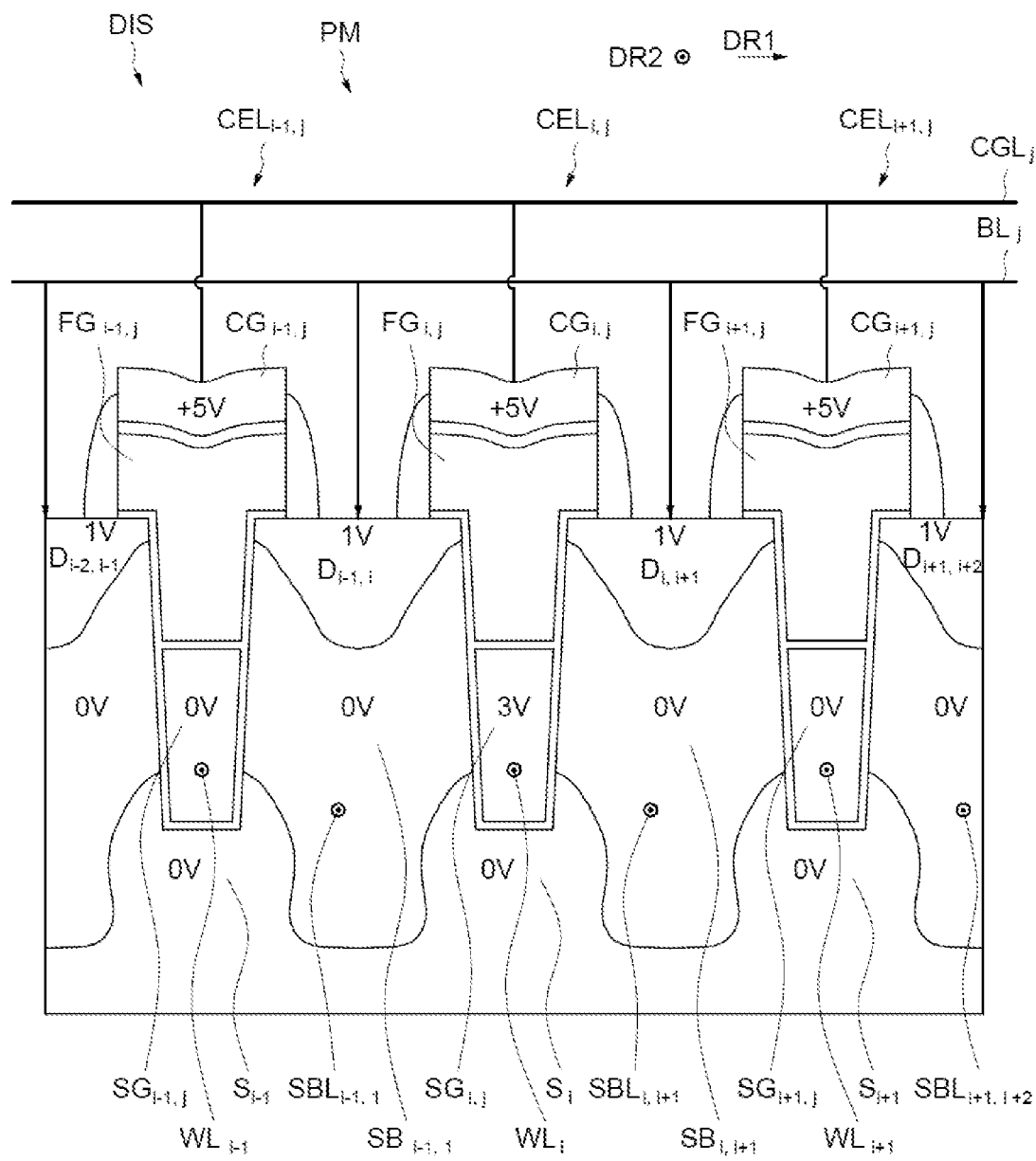

The same reasoning is applied to the read mode shown in FIG. 10, using different voltage values, namely +5 volts on the control gates connected to the line $CGL_j$, 0 volts on the control gates connected to the other lines CGL, 1 volt on the drain areas connected to the bit line $BL_j$, 0 volts on the substrate areas, 0 volts on the source areas, and 3 volts on the selection gates of the cells connected to the word line $WL_i$.

Thus only the cell $CEL_{i,j}$ is read.

Reference will now be made more particularly to FIGS. 11 to 20 for the highly schematic description of some steps of a method for manufacturing a memory device such as that described above, these figures illustrating a way of making contact on the selection gates, substrate areas and source regions.

In each of FIGS. 11 to 20, the left-hand side shows a partial sectional view, the second direction DR2 being perpendicular to the plane of this left-hand part, while the right-hand part of the figure shows a sectional view taken along the line AA of the left-hand part of the figure, the second direction DR2 being parallel to the plane of this right-hand part this time.

Figure 11:
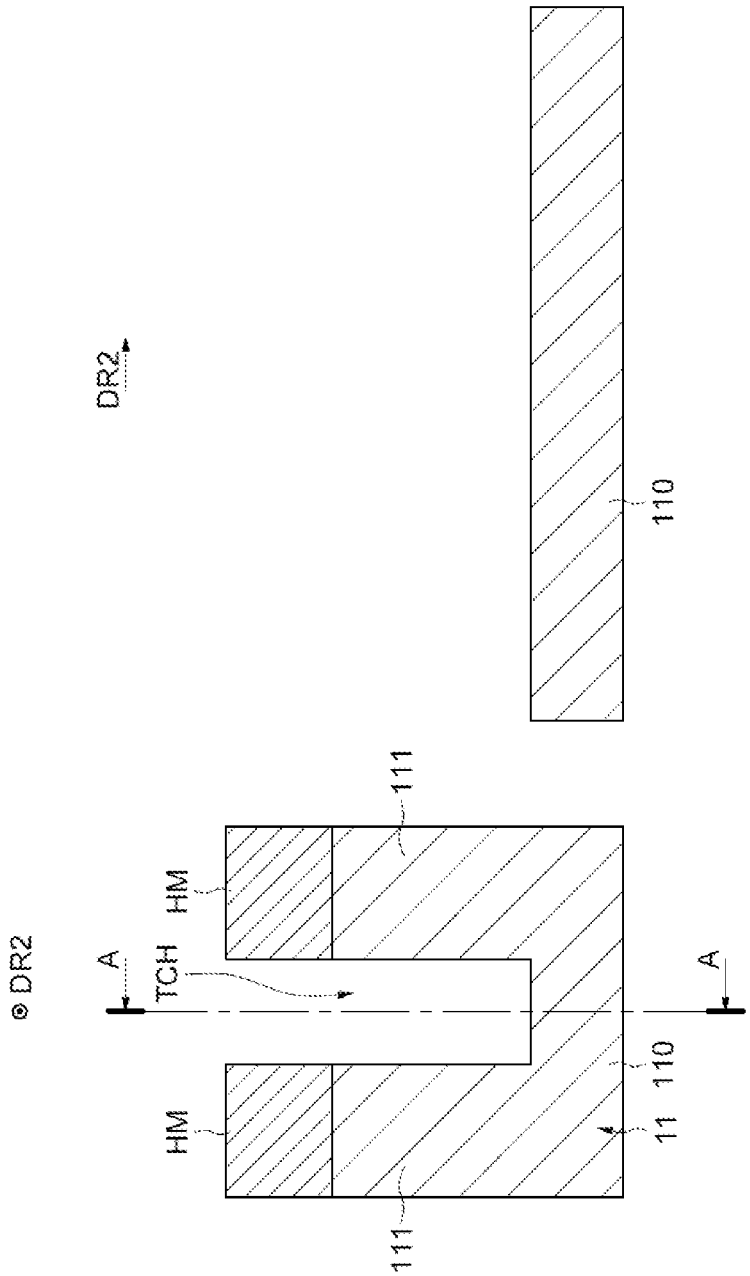

In FIG. 11, the reference 11 denotes a substrate in which, in a conventional and known manner, a trench TCH is formed, using a hard mask HM.

After the etching of this trench TCH, the region no shows schematically the future source region, while the areas 111, located on either side of the trench TCH, will form the future substrate areas.

As detailed below, the trench TCH is designed to receive the embedded selection gates of a plurality of memory cells, together with the embedded parts of the floating gates of a plurality of memory cells.

Figure 12:
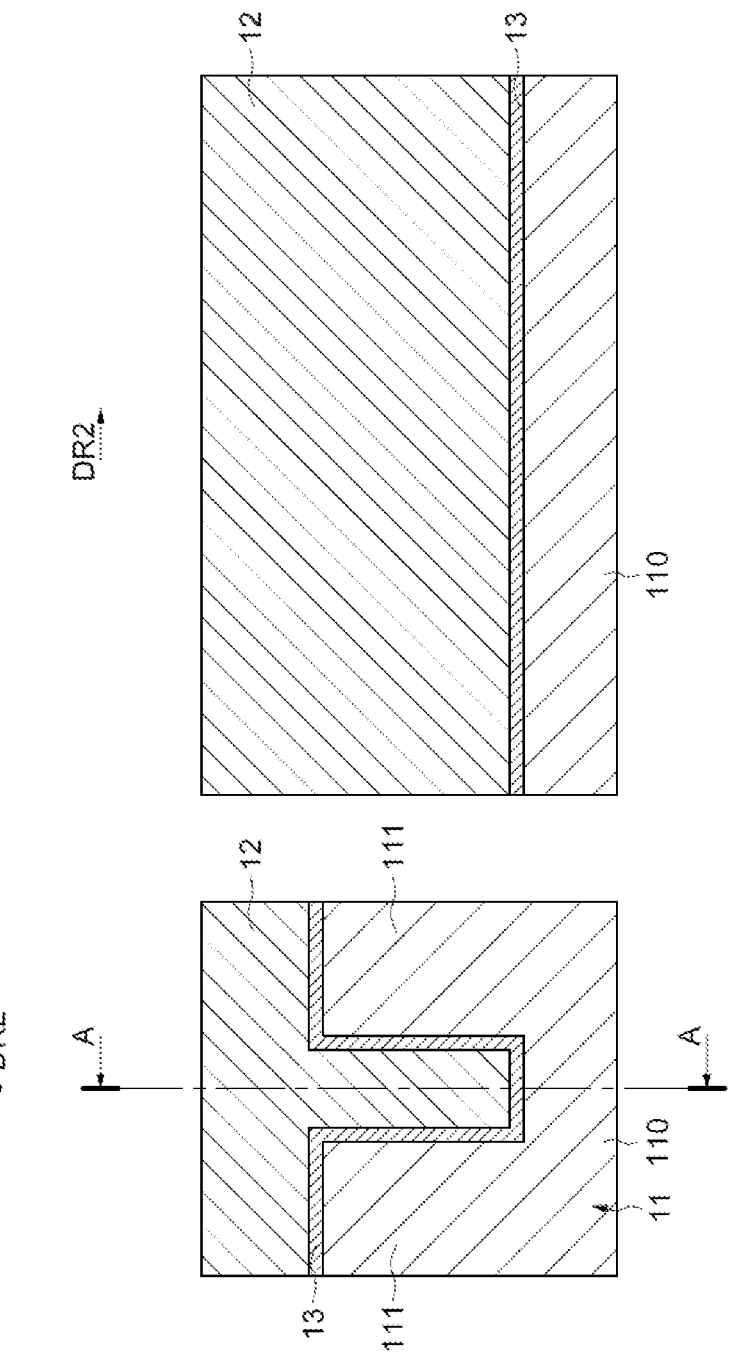

Then, as shown in FIG. 12, after the formation, for example, of a layer of silicon dioxide 13 (which will form the future oxide OX3 insulating the gate of the selection transistor from the substrate region), a first polysilicon layer 12 is deposited in a conventional manner, notably filling the trench TCH.

Figure 13:
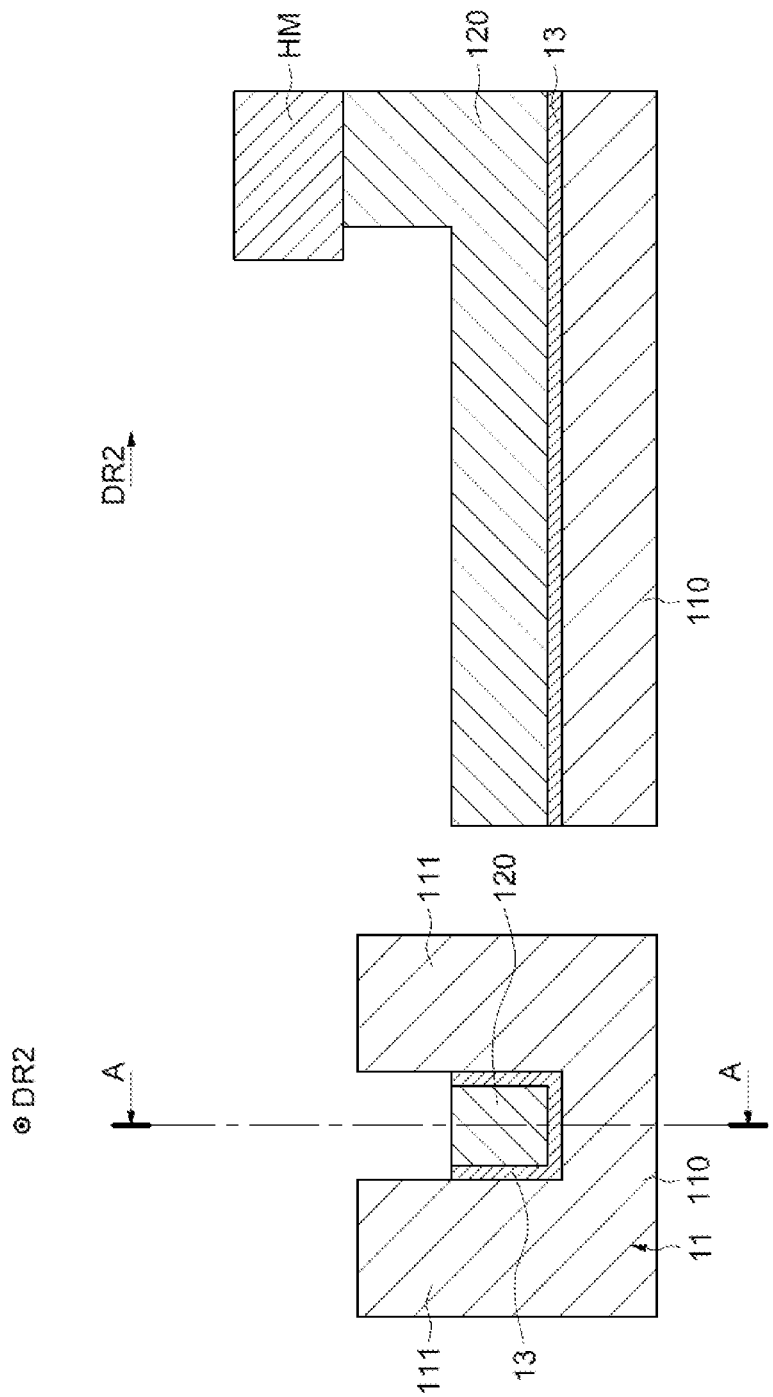

Then, as shown in FIG. 13, another hard mask HM is used for the partial etching of the polysilicon 12 to produce a residual polysilicon region 120.

As detailed below, this polysilicon region 120 will form future embedded selection gates.

To simplify the figure, the oxide portions 13 covering the areas 111 above the region 120 have not been illustrated. In any case, these oxide portions 13 that are not illustrated will be covered in the next step by another layer of silicon dioxide.

Figure 14:
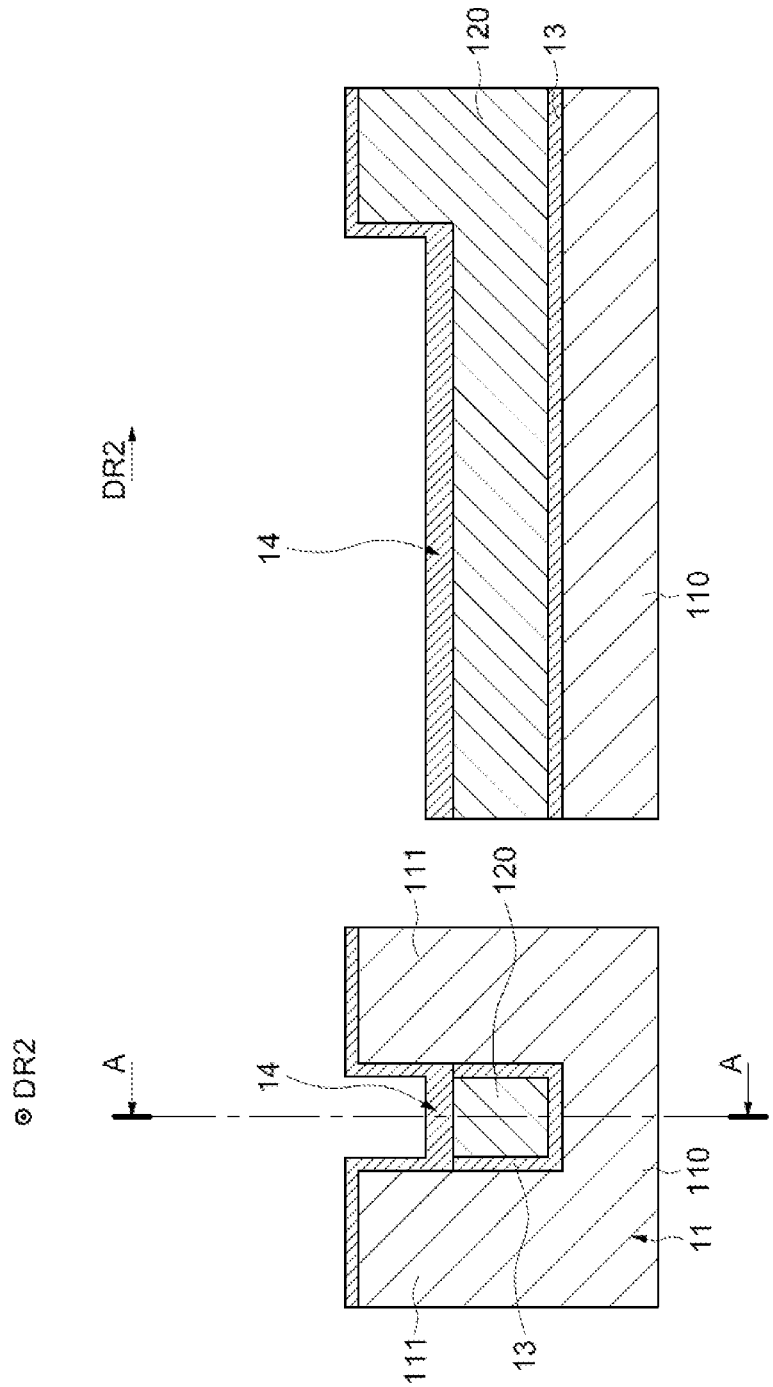

This is because, as shown in FIG. 14, silicon dioxide 14 is grown in a conventional and known manner on the structure of FIG. 13. This growth on highly doped polysilicon will enable the future oxide OX2 to be produced with a greater thickness.

Figure 15:
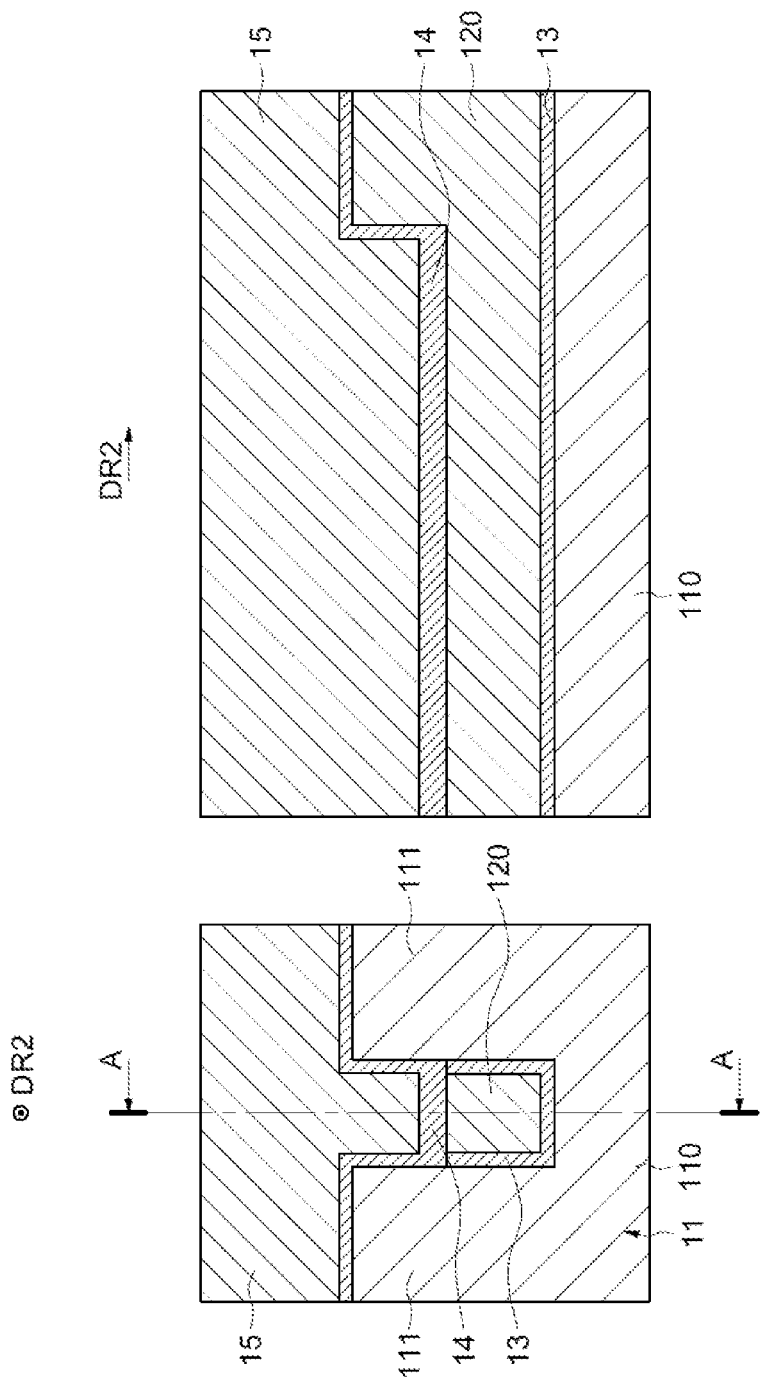

As shown in FIG. 15, a second polysilicon layer 15 is subsequently deposited on the oxide layer 14.

Figure 16:
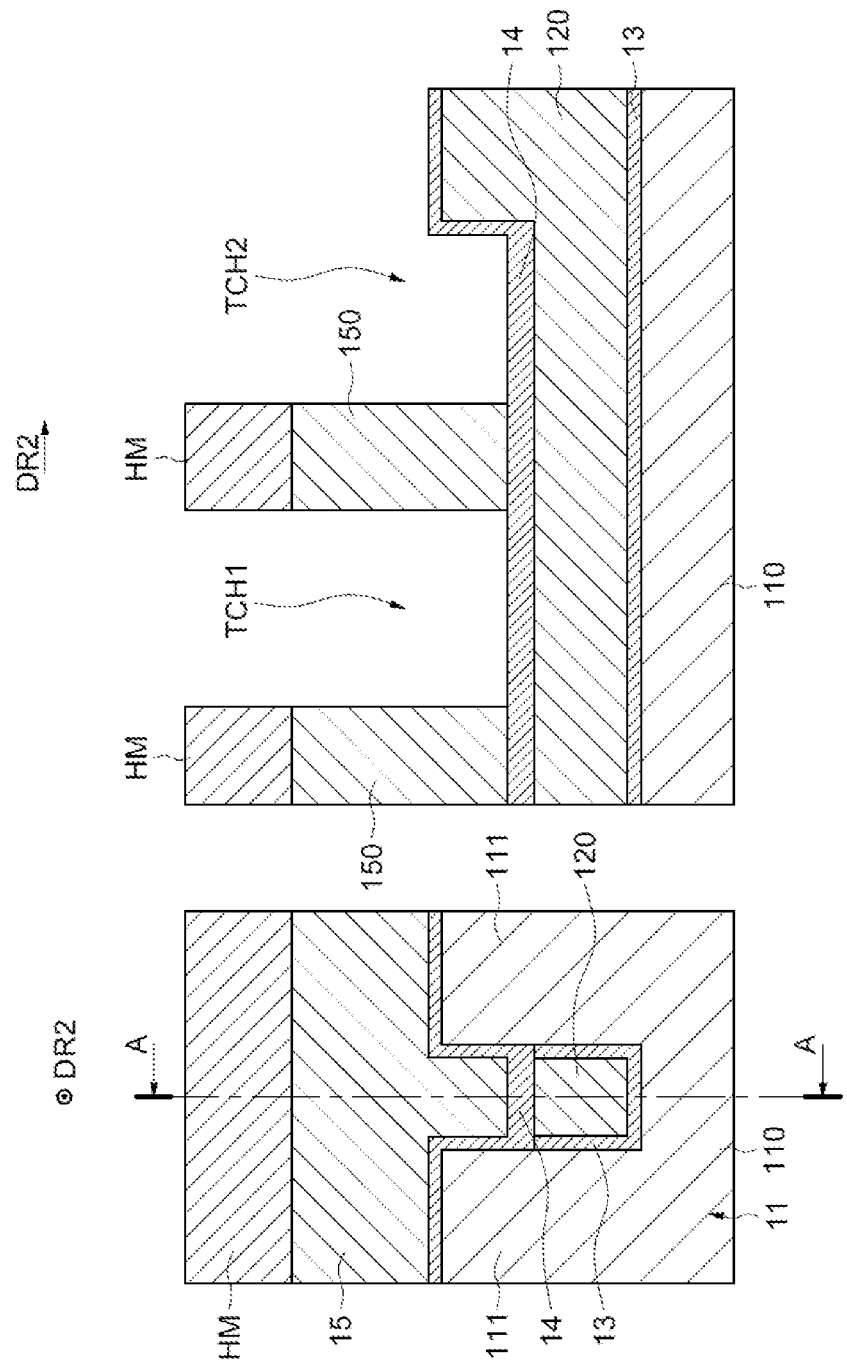
Figure 17:
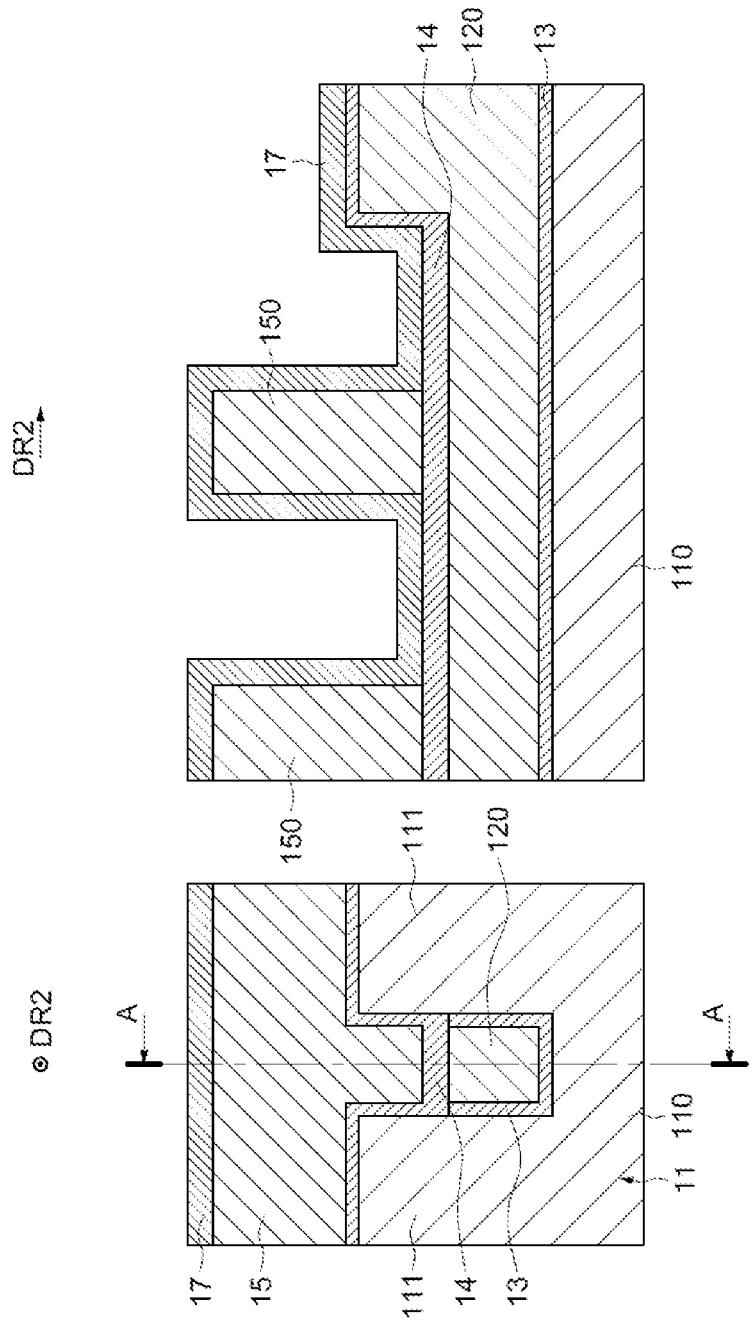

Then, as shown in FIG. 16, the polysilicon layer 15 is partially etched, using another hard mask HM, so as to define two trenches TCH1 and TCH2 separating polysilicon blocks 150.

A layer of an insulating material 17, for example a stack of silicon dioxide, silicon nitride and silicon dioxide, known by the acronym ONO to those skilled in the art, is then deposited on the structure of FIG. 16.

Figure 18:
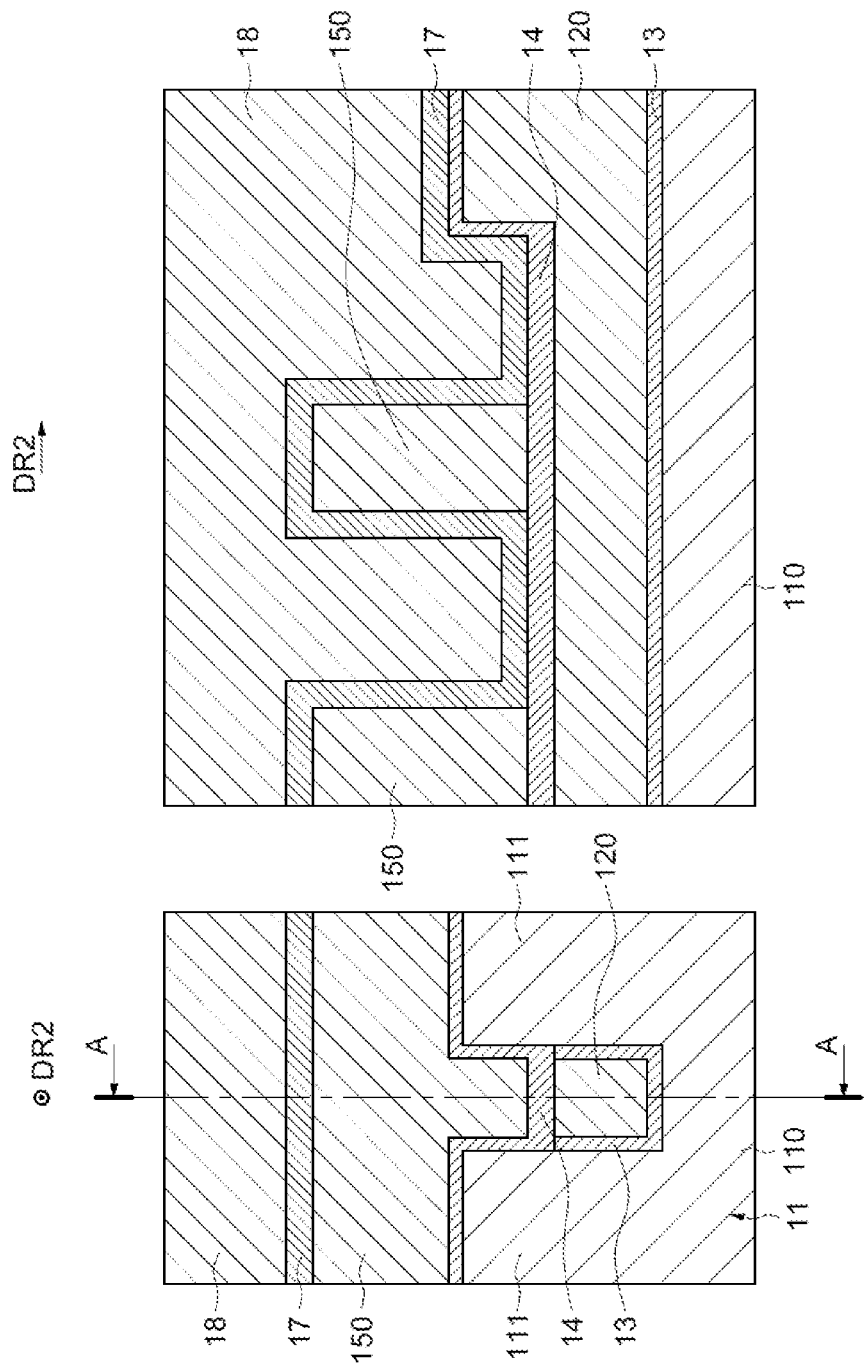

Then, in FIG. 18, a third polysilicon layer 18 is deposited to cover the insulating material 17.

Figure 19:
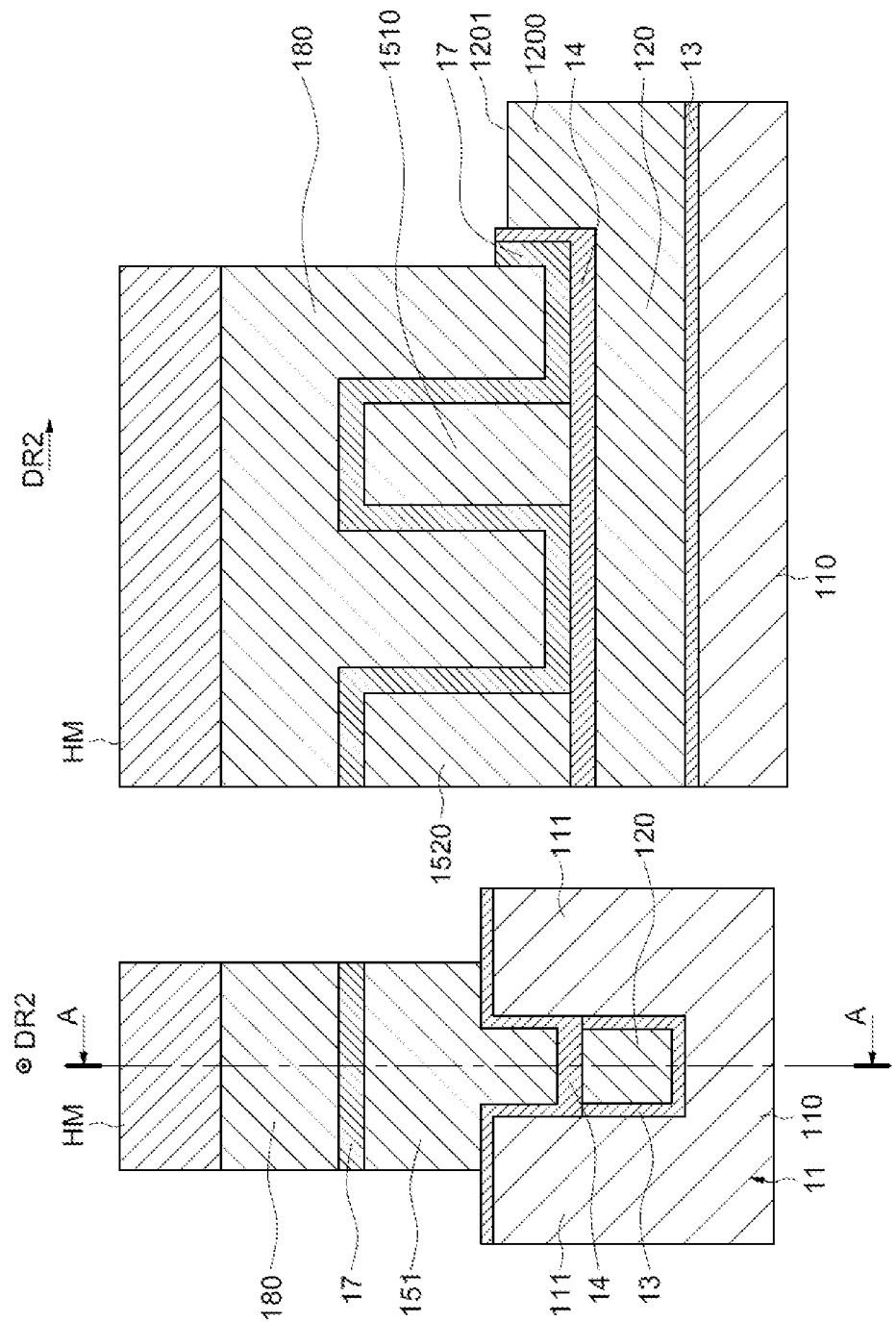

Then, as shown in FIG. 19, further etching is carried out using another hard mask HM, so as to delimit the floating gates and the control gates.

On the right-hand side of the figure, the references 1510 and 1520 represent two floating gates of two adjacent cells, while the reference 80 represents the control gates of these two adjacent cells.

On the left-hand side of the figure, it can be seen that the etched part 151 of the polysilicon does indeed have an embedded part forming the embedded part of a floating gate and a part projecting above the substrate areas 111.

It should be noted that, for the sake of simplicity, these figures do not show the insulation areas for insulating, notably, the two control gates of the two adjacent cells.

The material 14 corresponds to the insulating material OX2 of FIG. 1, while the material 17 corresponds, notably, to the oxide OX1 of FIG. 1, and the material 13 corresponds to the oxide OX3 of FIG. 1.

Figure 20:
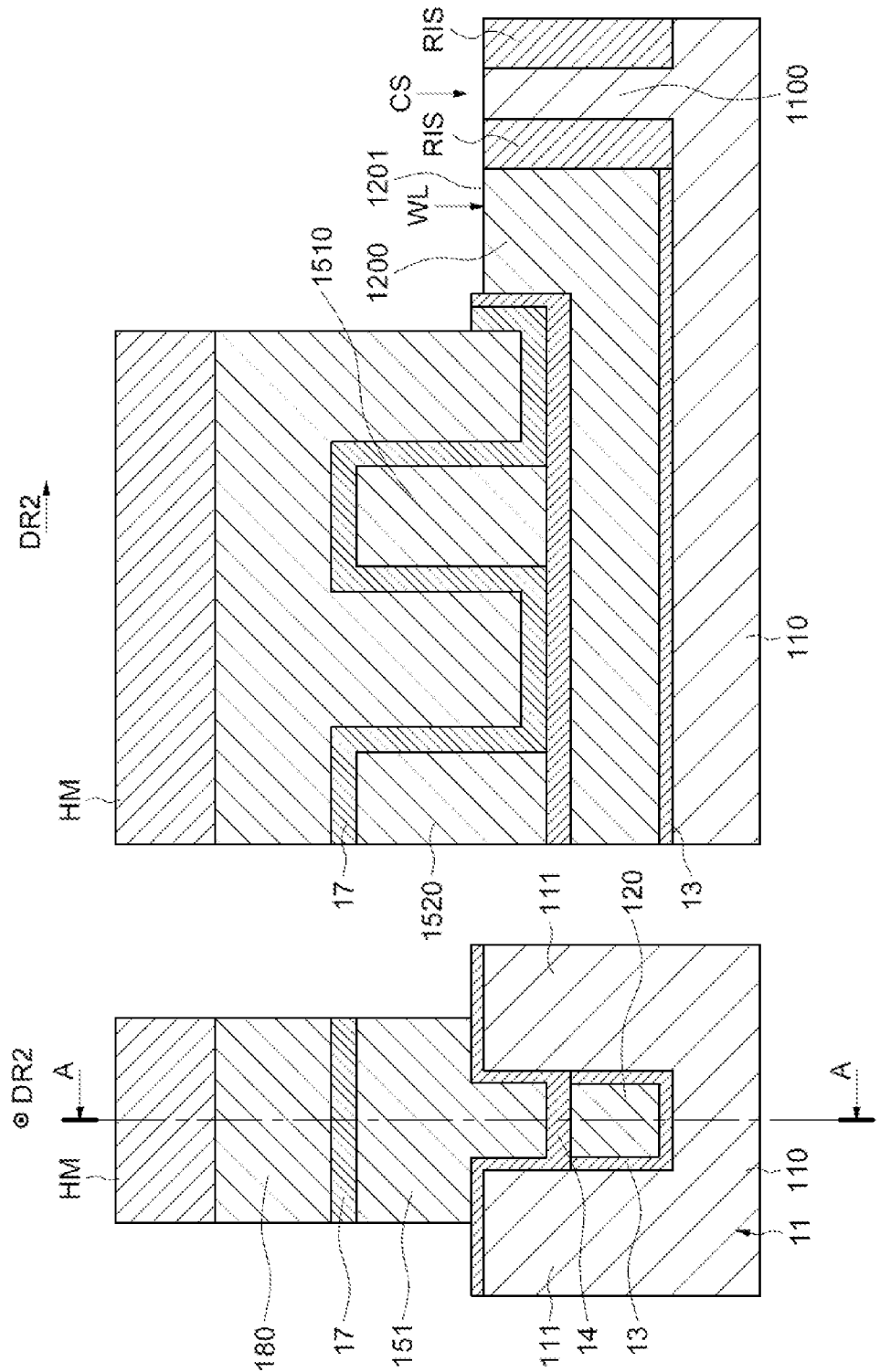

The upper surface 1201 of the step 1200 shown on the right of the right-hand part of FIG. 19 can be used, as shown in FIG. 20, to provide a contact area for the selection gates of the cells of this line, this contact area being connected to the word line WL.

Additionally, as shown in FIG. 20, the contact area CS for contacting the source regions 110 is provided by using a well 1100 insulated laterally from the step 1200 by an insulating region RIS.

Similarly, the substrate areas 111 are contacted in a similar way to that described for the source region, using other polysilicon wells, not shown on FIG. 20 for the sake of simplicity.

The invention is not limited to the embodiments and applications described above, but includes all variants thereof.

Figure 21:
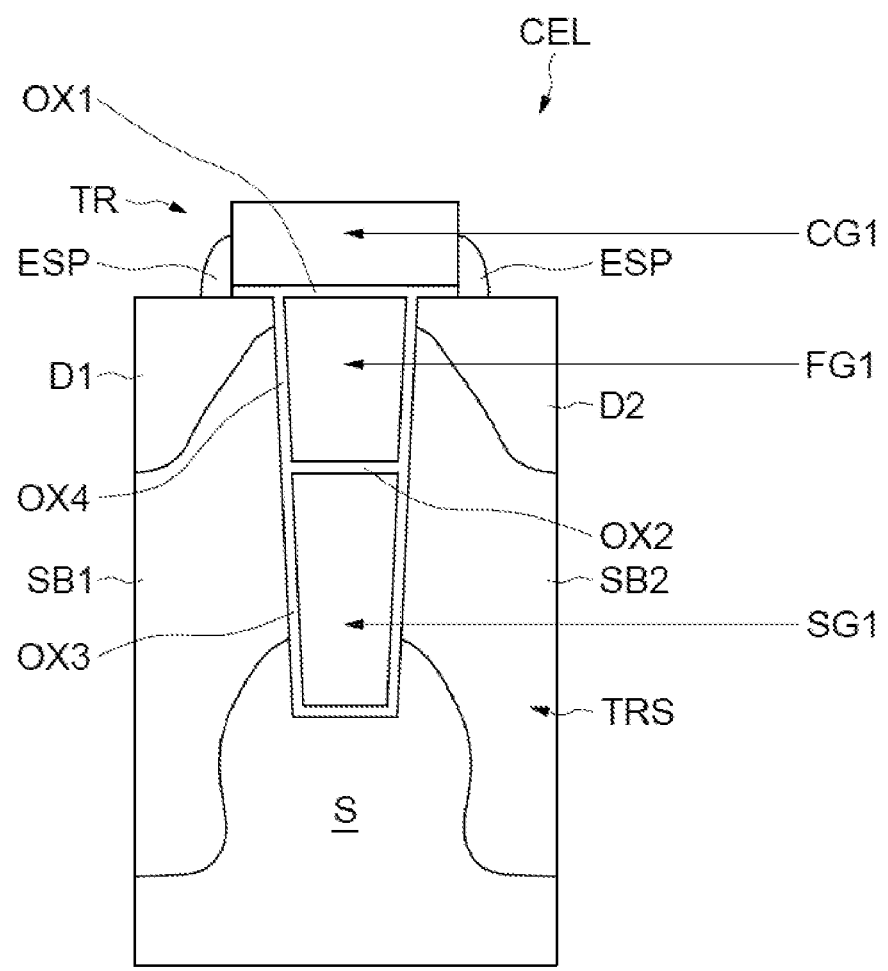

Thus, as illustrated in FIG. 21, it is possible to provide a memory cell CEL having a floating gate FG1 completely embedded in the substrate above the embedded selection gate SG1.

Consequently, the control gate CG1 of this memory cell requires only a single polysilicon level above the substrate.

Figure 22:
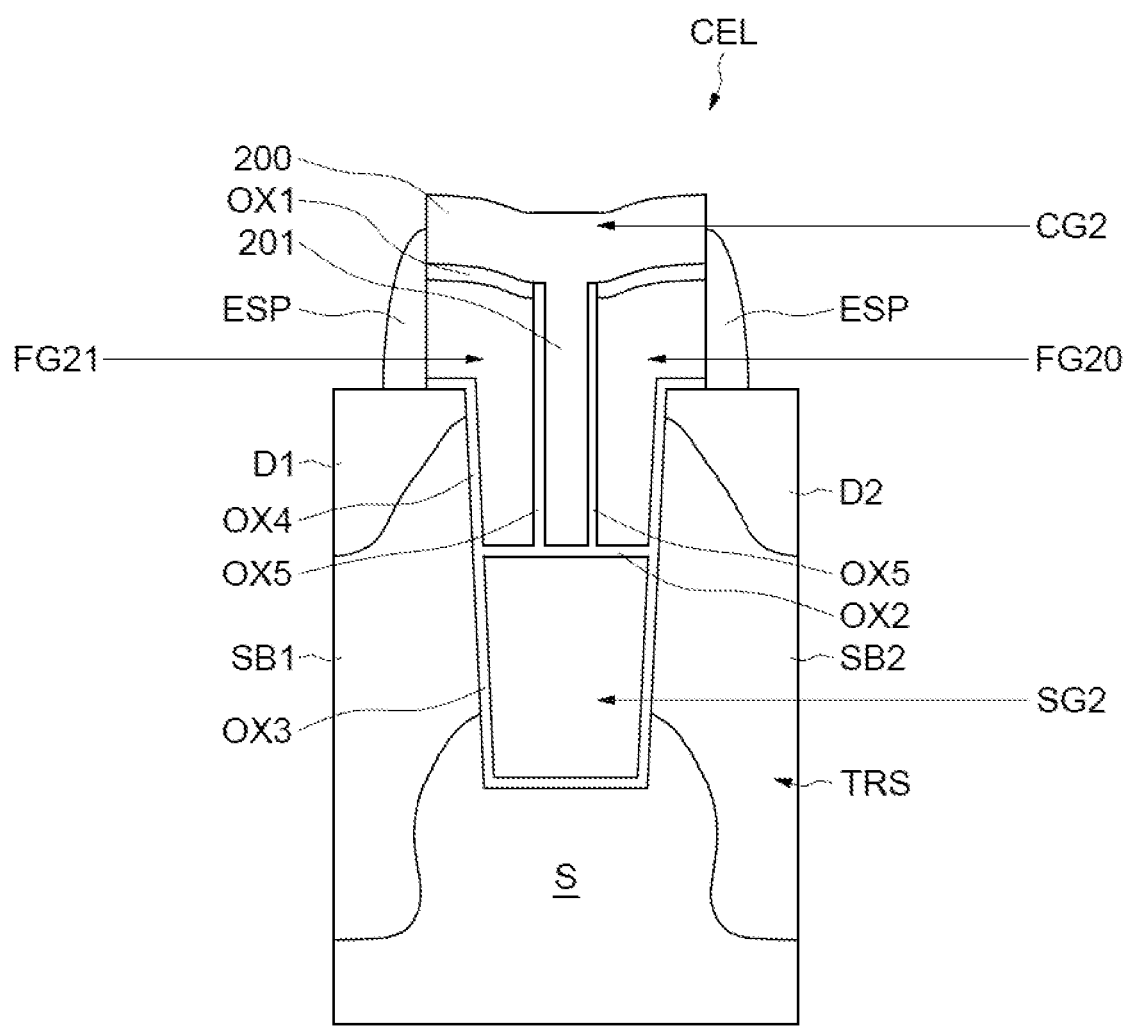

It is also possible, as shown in FIG. 22, to provide a memory cell CEL whose floating gate comprises two insulated blocks FG20 and FG21, separated by a first pall 201 of the control gate CG2, this first part 201 extending to the vicinity of the embedded insulated selection gate SG2.

An insulating material, for example a gate oxide, OX5, electrically insulates the two blocks FG20 and FG21 from the first part 201 of the control gate CG2.

The control gate CG2 also has a second pall 200 insulated from the two blocks $FG_{20}$ and FG21 of the floating gate and surmounting these two blocks.

This cell advantageously enables two bits to be stored per cell. It would also be possible to have a combination of the embodiments of FIGS. 21 and 22, in other words to have a floating gate consisting of two blocks completely embedded in the substrate and separated by the first part 201 of the control gate, the second part 200 of the control gate then being formed by a single level of polysilicon above the substrate.

What is claimed is:

1. A memory cell, comprising:
   a semiconductor substrate comprising a source region, a drain region disposed over the source region, and a substrate region interposed between the source region and the drain region;
   a selection transistor comprising a selection gate embedded in the semiconductor substrate, the selection gate comprising an upper portion laterally adjacent to the substrate region of the semiconductor substrate, and a lower portion laterally adjacent to and over the source region of the semiconductor substrate;
   a first insulating layer lining sidewalls and a bottom-most surface of the selection gate;
   a second insulating layer lining a top-most surface of the selection gate, wherein a thickness of the second insulating layer is greater than a thickness of the first insulating layer;
   a state transistor comprising a floating gate comprising an embedded portion embedded in the substrate region of the semiconductor substrate and disposed over the upper portion of the selection gate such that the second insulating layer is interposed between the embedded portion of the floating gate and the upper portion of the selection gate; and
   a control gate insulated from the floating gate and disposed at least partially over the floating gate.

2. The memory cell of claim 1, wherein the control gate and the source region, the drain region, and the substrate region of the semiconductor substrate are individually polarizable.

3. The memory cell of claim 1, wherein the embedded portion of the floating gate is laterally adjacent to the substrate region of the semiconductor substrate and laterally adjacent to the drain region of the semiconductor substrate.

4. The memory cell of claim 1, wherein the drain region comprises two individually polarizable drain regions located on either side of the embedded portion of the floating gate.

5. The memory cell of claim 1, wherein the substrate region comprises two individually polarizable substrate regions located on either side of the embedded portion of the floating gate.

6. The memory cell of claim 1, wherein the thickness of the first insulating layer is greater than or equal to 90 Angstroms.

7. The memory cell of claim 1, wherein the floating gate comprises an overlying portion disposed over the embedded portion of the floating gate and projecting out of the semiconductor substrate.

8. The memory cell of claim 7, wherein the control gate is insulated from the floating gate and disposed at least partially over the overlying portion of the floating gate.

9. The memory cell of claim 1, further comprising a third insulating layer lining sidewalls of the embedded portion of the floating gate.

10. The memory cell of claim 9, wherein the thickness of the second insulating layer is greater than a thickness of the third insulating layer.

11. The memory cell of claim 1, wherein the memory cell is erasable by Fowler-Nordheim effect and is programmable by source-side carrier injection.

12. A memory device comprising a memory plane including a plurality of memory cells arranged in matrix form along first lines parallel to a first direction and second lines parallel to a second direction, each memory cell comprising:
a semiconductor substrate comprising a source region, a drain region disposed over the source region, and a substrate region interposed between the source region and the drain region;
a selection transistor comprising a selection gate embedded in the semiconductor substrate, the selection gate comprising an upper portion laterally adjacent to the substrate region of the semiconductor substrate, and a lower portion laterally adjacent to and over the source region of the semiconductor substrate;
a first insulating layer lining sidewalls and a bottom-most surface of the selection gate;
a second insulating layer lining a top-most surface of the selection gate, wherein a thickness of the second insulating layer is greater than a thickness of the first insulating layer;
a state transistor comprising a floating gate comprising an embedded portion embedded in the substrate region of the semiconductor substrate and disposed over the upper portion of the selection gate such that the second insulating layer is interposed between the embedded portion of the floating gate and the upper portion of the selection gate;
a control gate insulated from the floating gate and disposed at least partially over the floating gate, wherein the control gate and the source region, the drain region, and the substrate region of the semiconductor substrate are individually polarizable;
wherein the control gates of all the memory cells of a same first line are polarizable by a first metallization layer;
wherein the drain regions of all the memory cells of the same first line are polarizable by a second metallization layer;
wherein two adjacent memory cells of the same first line share a common drain region;
wherein the selection gates of all the memory cells of a same second line are polarizable by a third metallization layer;
wherein two adjacent memory of the same second line share a common substrate region;
wherein all the common substrate regions of the same second line are polarizable by a fourth metallization layer; and
wherein the source regions of all the memory cells of the memory plane are polarizable simultaneously.

13. The memory device of claim 12, wherein the embedded portion of the floating gate is laterally adjacent to the substrate region of the semiconductor substrate and laterally adjacent to the drain region of the semiconductor substrate.

14. The memory device of claim 13, wherein the drain region comprises two individually polarizable drain regions located on either side of the embedded portion of the floating gate.

15. The memory device of claim 13, wherein the substrate region comprises two individually polarizable substrate regions located on either side of the embedded portion of the floating gate.

16. The memory device of claim 12, wherein a selected memory cell of the memory device is erasable by applying an erasing potential difference between the control gate and the substrate region of the selected memory cell, the erasing potential difference being above an erasure threshold; and applying a voltage on the selection gate of the selected memory cell so as to prevent a breakdown of an insulating material that insulates the selection gate from the substrate region of the selected memory cell.

17. A method of operating a selected memory cell of the memory device according to claim 12, the method comprising:
erasing the selected memory cell by applying an erasing potential difference between the control gate and the substrate region of the selected memory cell, the erasing potential difference being above an erasure threshold; and applying a voltage on the selection gate of the selected memory cell so as to prevent a breakdown of an insulating material that insulates the selection gate from the substrate region of the selected memory cell.

18. The method of claim 17, further comprising:
programming the selected memory cell by applying a programming potential difference between the control gate of the selected memory cell and the substrate region of the selected memory cell, the programming potential difference being above a programming threshold; and
applying a voltage to the selection gate of the selected memory cell to cause the selection transistor to conduct.

19. The method of claim 17, further comprising:
reading the selected memory cell by applying a read control voltage to the control gate of the selected memory cell; applying a further voltage to the selection gate of the selected memory cell to cause the selection transistor to conduct; applying a read voltage to the drain region; and connecting the source region and the substrate region of the selected memory cell to a zero voltage.

* * * * *